US008819600B2

(12) United States Patent
Droz et al.

(10) Patent No.: US 8,819,600 B2
(45) Date of Patent: Aug. 26, 2014

(54) POLYGON RECOVERY FOR VLSI MASK CORRECTION

(71) Applicant: International Business Machines Corporation, Armonk, NY (US)

(72) Inventors: Patrick Droz, Oberrieden (CH); Paul Hurley, Rueschlikon (CH); Rajai Nasser, Pulley (CH); Joseph Paki, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/682,056

(22) Filed: Nov. 20, 2012

(65) Prior Publication Data

US 2014/0143739 A1 May 22, 2014

(51) Int. Cl.
*G06F 17/50* (2006.01)
(52) U.S. Cl.
USPC .................................. 716/51; 716/50; 716/54
(58) Field of Classification Search
None
See application file for complete search history.

(56) References Cited

U.S. PATENT DOCUMENTS 7,703,049 B2 * 4/2010 Abrams et al. .................. 716/50
8,056,021 B2 * 11/2011 Abrams et al. .................. 716/50
8,151,236 B2 * 4/2012 Su et al. ......................... 716/124
8,336,006 B2 * 12/2012 Kodera et al. ................... 716/55
8,402,399 B2 * 3/2013 Hurley et al. .................... 716/55
8,510,699 B1 * 8/2013 Acar et al. ...................... 716/119

OTHER PUBLICATIONS

Scheibler, et al., "Fast Continuous Haar and Fourier Transforms of Rectilinear Polygons from VLSI Layouts", CoRR, abs/1010.5562, Oct. 27, 2010.

* cited by examiner

*Primary Examiner* — A. M. Thompson
(74) *Attorney, Agent, or Firm* — Cantor Colburn LLP; Daniel Morris

(57) ABSTRACT

Embodiments relate to polygon recovery from a +1/−1 description of a plurality of polygons of a very large scale integrated (VLSI) mask for production of a VLSI semiconductor device. An aspect includes receiving a set of data comprising the +1/−1 description of the plurality of polygons of the VLSI mask, the +1/−1 description comprising a plurality of corners. Another aspect includes determining a 4-directional data structure, a Mm value comprising a first limit value, and a Mp value comprising a second limit value for each of the plurality of corners. Another aspect includes recovering the plurality of polygons from the set of data by assigning each of the plurality of corners to a single polygon based on the 4-directional data structure, the Mm value, and the Mp value of each of the plurality of corners, and determining an order of the respective corners of each polygon.

16 Claims, 8 Drawing Sheets

400

RECEIVE DATA SET COMPRISING +1/-1 DATA FOR
CORNERS OF A PLURALITY OF POLYGONS;
DETERMINE 4-DIRECTIONAL DATA STRUCTURE FOR CORNERS
401

↓

INTEGRATE 4-DIRECTIONAL DATA STRUCTURE ALONG X DIRECTION
402

↓

INTEGRATE 4-DIRECTIONAL DATA STRUCTURE ALONG Y DIRECTION
403

↓

RECOVER AND OUTPUT ORDERED CORNER DATA FOR EACH INDIVIDUAL POLYGON
404

POLYGON RECOVERY FOR VLSI MASK CORRECTION

BACKGROUND

This disclosure relates generally to semiconductor device fabrication, and more particularly to the design of very large scale integrated (VLSI) semiconductor devices.

A design for a VLSI mask may include a plurality of rectilinear polygons that define the mask that is used in production of a semiconductor device. A typical VLSI mask design must be verified before the physical masks are created and the design is sent to production, as building a physical mask for use in production is an expensive process. Design faults in a VLSI design should be identified and eliminated as early as possible, before the physical mask is built. Design faults may be identified by performing a printability simulation of the VLSI design. However, a printability simulation of a VLSI design may be a computationally expensive task, especially for a full-chip simulation of a relatively large layout.

Verification of a VLSI mask may be performed using Fourier transforms of the polygons that make up the mask in order to analyze the polygons. In order to describe the polygons that make up a VLSI design, +1/−1 description may be used. This description allows relatively fast and accurate Fourier transforms of the polygons for simulation and analysis of lithographic processes to determine any design faults in a VLSI layout. The +1/−1 description of a mask comprises a two dimensional signal of +1's or <1's positioned at the corners of the polygons according to the following rules: the values of two adjacent corners of the same polygon are opposite (a+1 is followed by a −1 or vice-versa), and the value at any down-left corner of any polygon is always +1. This +1/−1 description is described in further detail in "Fast Continuous Haar and Fourier Transforms of Rectilinear Polygons from VLSI Layouts", by Robin Scheibler, Paul Hurley, and Amina Chebira, arXiv:1010.5562 [cs.CE], 27 Oct. 2010, which is herein incorporated by reference in its entirety.

SUMMARY

A method, computer program product, and system for polygon recovery from a +1/−1 description of a plurality of polygons are provided. An aspect includes receiving, by a computer, a set of data comprising the +1/−1 description of the plurality of polygons, the +1/−1 description comprising a plurality of corner. Another aspect includes determining a 4-directional data structure, a Mm value, and a Mp value for each of the plurality of corners. Another aspect includes recovering the polygons by assigning each of the plurality of corners to one of the plurality of polygons based on the 4-directional data structure, the Mm value, and the Mp value for each of the plurality of corners, and, for each of the plurality of polygons, determining an order of the polygon's respective corners.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of polygon recovery for VLSI mask correction are provided, with exemplary embodiments being discussed below in detail. After the Fourier transform of the +1/−1 description corresponding to a mask has been evaluated and corrected, the polygons comprising the corrected mask need to be recovered from the +1/−1 description. However, recovery of the polygons from +1/−1 description may be computationally expensive. Therefore, a data structure may be defined that allows recovery of polygons from their +1/−1 description by assigning each of the plurality of corners listed in the +1/−1 description to one of the plurality of polygons, and, for each of the plurality of polygons, determining an order of the polygon's respective corners. A list of coordinates of the polygons' corners, together with their +1/−1 weights, may be taken as input to generate a linked list of polygon nodes, where each polygon node contains a linked of the polygon's corners. The corners may be sorted in a clockwise manner in some embodiments. The running time required to recover the polygons may be O(k log k), where k is the number of corner points. The running time is independent of the size of the grid on which the polygons are located, and may be used in embodiments in which the corners are not aligned to any particular grid. The polygons may be recovered based on a 4-directional data structure and Mm and Mp values which are determined for each of the plurality of corners.

Figure 1A:
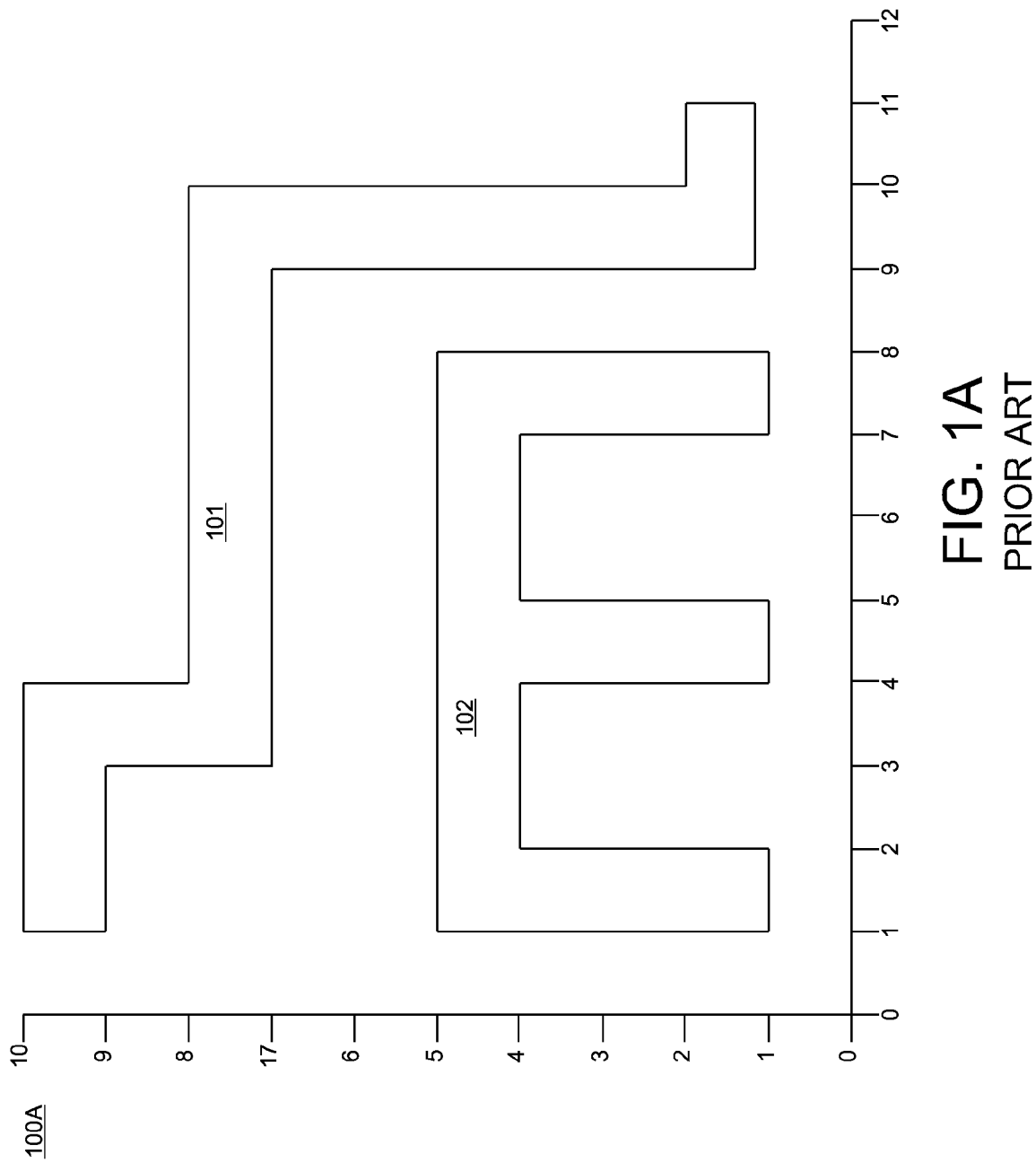
FIG. 1A is a graph illustrating an embodiment of polygons for a VLSI mask.
Figure 1B:
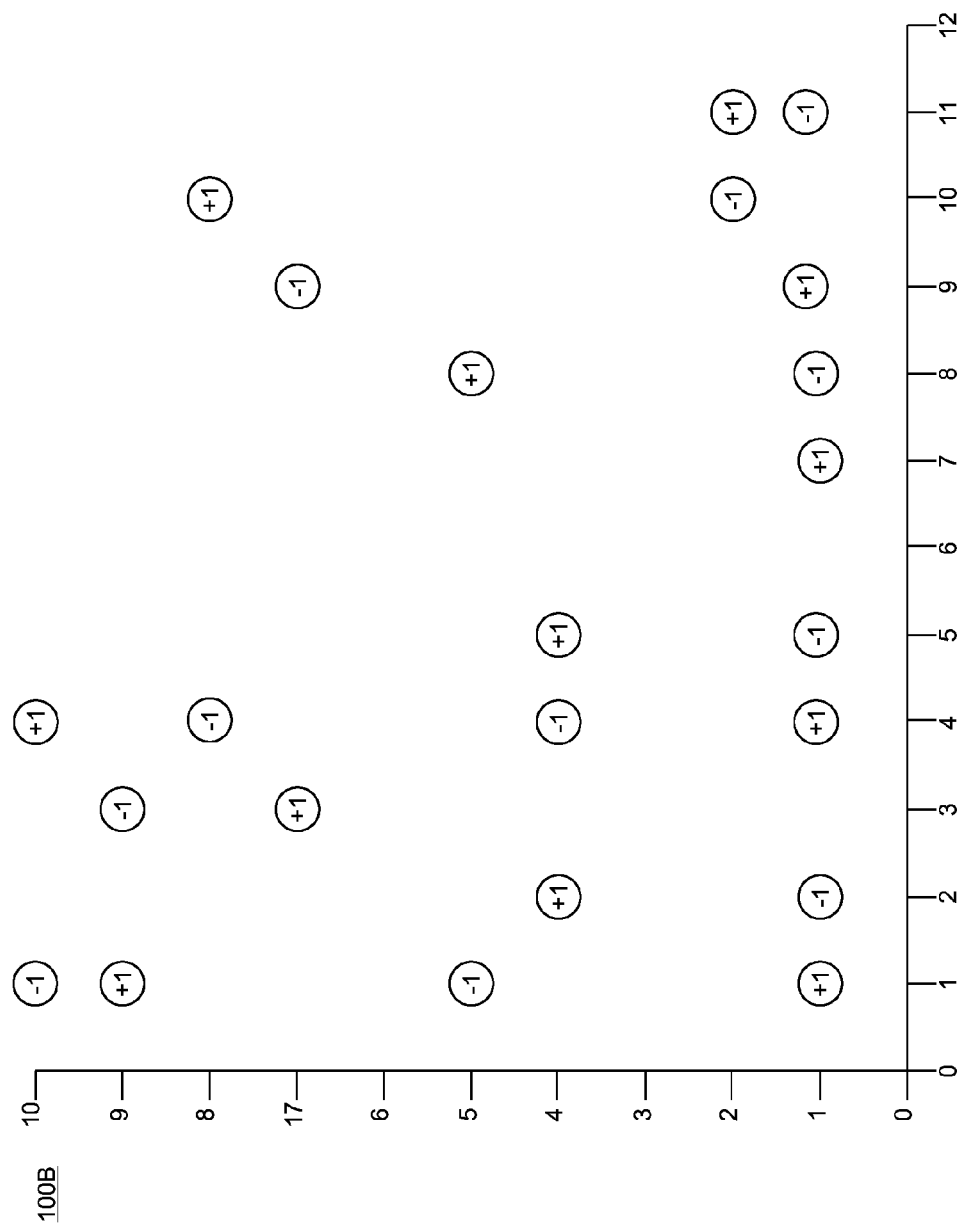
FIG. 1B is a graph of a +1/−1 description of the polygons of FIG. 1A.

FIG. 1A is a graph 100A showing example polygons 101 and 102, and FIG. 1B is a graph 100B shows a corresponding +1/−1 description of the polygons 101 and 102 of FIG. 1A. Graph 100A, including polygons 101 and 102, may comprise a portion of a VLSI mask. As shown in FIG. 1B, graph 100B comprises a plurality of points, each point corresponding to a corner of one of polygons 101 and 102. Adjacent corners in the same polygon have opposite weights, +1 or −1. Each of the points in FIG. 1B may be described by the set of $(x_i, y_i, c_i)$, for i from 1 to k, where $(x_i, y_i)$ is the coordinates of the corner, $c_i$ its corresponding +1 or −1 weight, and k is the number of corners. Because of the sparsity of the +1/−1 representation, it is possible to efficiently calculate it from the Fourier transform of the mask. However, there is no particular ordering to the resulting points in the +1/−1 notation, so that is not known to which polygon, of polygons 101 and 102, each individual point in graph 100B belongs. Thus, an efficient mechanism to convert from the +1/−1 representation to the standard form where every polygon is described by a list of its corners sorted in a clockwise (or equivalently anti-clockwise) manner is needed.

In order to recover the polygon patterns, the value of the mask function M in the neighborhood of the corner points is also determined. At each corner point, two limits are calculated:

$$M(x_i^-, y_i^-) = \lim_{\substack{(x,y) \to (x_i, y_i) \\ x < x_i, y < y_i}} M(x, y) \sum_{\substack{x_j < x_i \\ y_j < y_i}} c_j, \quad \text{(EQ. 1)}$$

and $$M(x_i^+, y_i^+) = \lim_{\substack{(x,y) \to (x_i, y_i) \\ x > x_i, y > y_i}} M(x, y) \sum_{\substack{x_j \leq x_i \\ y_j \leq y_i}} c_j. \quad \text{(EQ. 2)}$$

Figure 2:
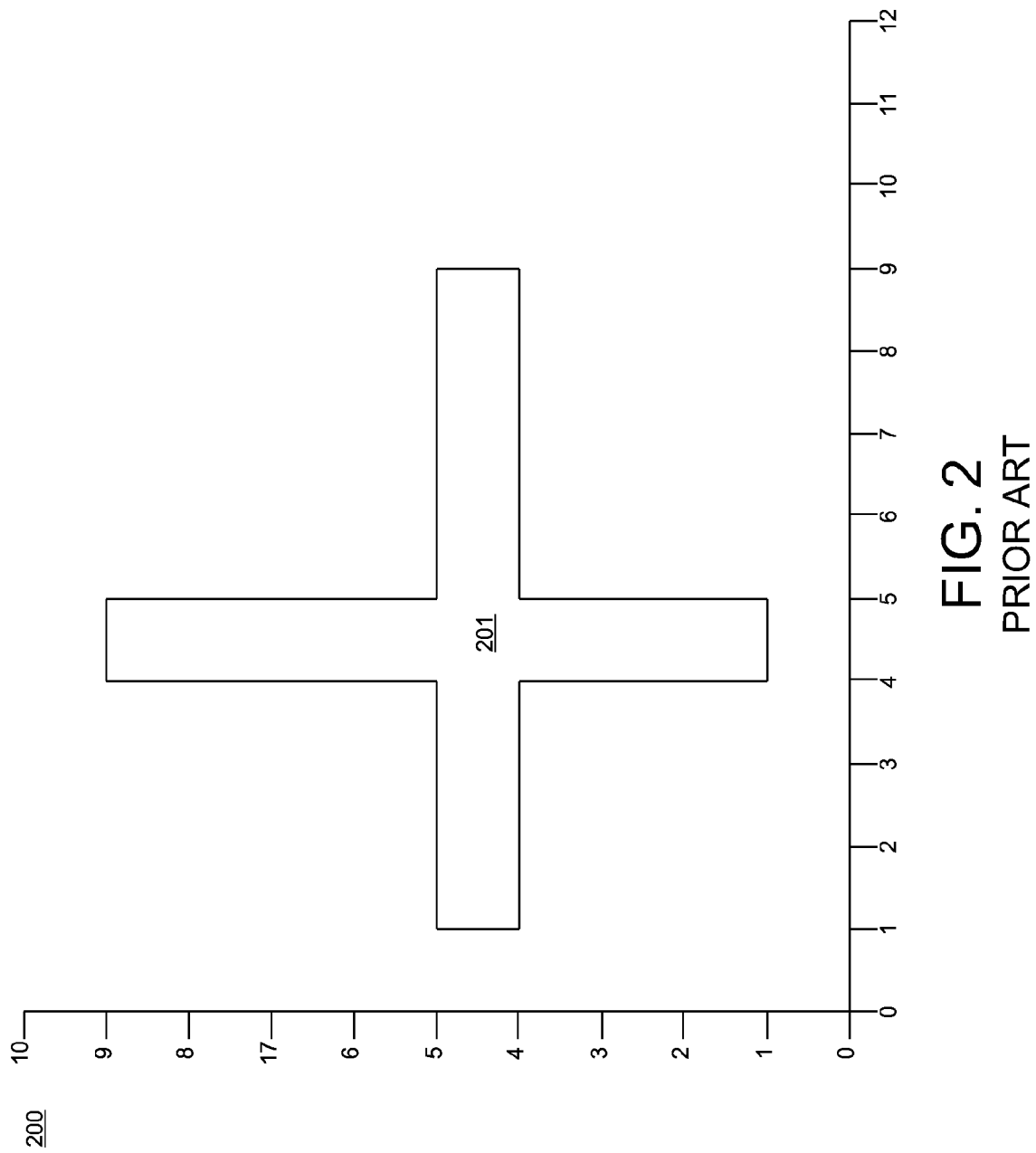
FIG. 2 is a graph illustrating another embodiment of a polygon for a VLSI mask.

From the limits described in Equations 1 and 2, it may be inferred how to move in order to navigate the corners in the clockwise (or counter-clockwise) direction to determine the individual polygons. This is illustrated with respect to example polygon 201 of graph 200 of FIG. 2. In some embodiments, the bottom-left corner may be selected as the starting corner; however, in various embodiments, any desired corner may be used as the starting corner, and appropriate adjustments to the algorithm may be made to account for the selection of the starting corner. If the bottom-left corner (4,1) of polygon 201 of FIG. 2 is selected as the starting corner, the next direction must be up, and the next corner is therefore determined to be (4,4). To determine the next corner from (4,4), it is known that the next direction is horizontal; however, it is not known whether to move left or right. There is one corner in the left direction (1, 4), and one corner in the right direction (5,4). In order to solve this ambiguity, the value of $M(4^+, 4^+)$ is used. If $M(4^+, 4^+)$ is 0, the next direction is right, and if $M(4^+, 4^+)$ is 1 the next direction is left. In the case of polygon 201 of FIG. 2, $M(4^+, 4^+)$ is equal to 1, and so the correct direction is left and the next corner is determined to be (1,4).

For each corner, in addition to the five values $x_i$, $y_i$, $c_i$, Mm, and Mp (which correspond to $M(x^-, y^-)$ and $M(x^+, y^+)$, respectively), a 4-directional data structure comprising 4 pointers may be defined for each corner to indicate the corner's next neighbor. The four pointers are Right, Down, Left and Up (R, D, L, U). As their names indicate, the pointers point towards the immediate neighbor in the indicated direction, and each pointer is set to 1 or 0. The four dimensional (R, D, L, U) structure may be defined as follows:

1. The right pointer R points towards the corner's immediate neighbor on the right in the same row. If such a neighboring corner does not exist, the right pointer points towards the leftmost corner of the next row in the up direction that contains a corner. If such a neighboring corner does not exist, i.e., if the current corner is the rightmost corner of the highest row, the right pointer points towards a dummy node called End.
2. The left pointer L points towards the corner's immediate neighbor on the left in the same row. If such a neighboring corner does not exist, the left pointer points towards the rightmost corner of the next row in the down direction that contains a corner. If such a neighboring corner does not exist, i.e., if the current corner is the leftmost corner of the lowest row, the left pointer points towards a dummy node called Start.
3. The up pointer U points towards the corner's immediate neighbor in the up direction in the same column. If such a neighboring corner does not exist, the up pointer points towards the lowest corner of the next column in the right direction that contains a corner. If such a neighboring corner does not exist, i.e., if the current corner is the highest corner of the rightmost column, the up pointer points towards End.
4. The down pointer U points towards the corner's immediate neighbor in the down direction in the same column. If such a neighboring corner does not exist, the down pointer points towards the highest corner of the next column in the left direction that contains a corner. If such a neighboring corner does not exist, i.e., if the current corner is the lowest corner of the leftmost column, the down pointer points towards Start.

The left and right pointers comprise a bidirectional linked list that may be referred to as a left-right linked list. Similarly, the down and up pointers comprise a bidirectional linked list that may be referred to as a down-up linked list. The left-right linked list sorts the corners according to the horizontal order defined by:

$$H(x', y') < H(x'', y'') \text{ if and only if } y' < y'' \text{ or } y' = y'' \text{ and } x' < x'' \quad \text{(EQ. 3)}$$

Similarly, the down-up linked list sorts the corners according to the vertical order defined by:

$$V(x', y') < V(x'', y'') \text{ if and only if } x' < x'' \text{ or } x' = x'' \text{ and } y' < y'' \quad \text{(EQ. 4)}$$

Figure 3A:
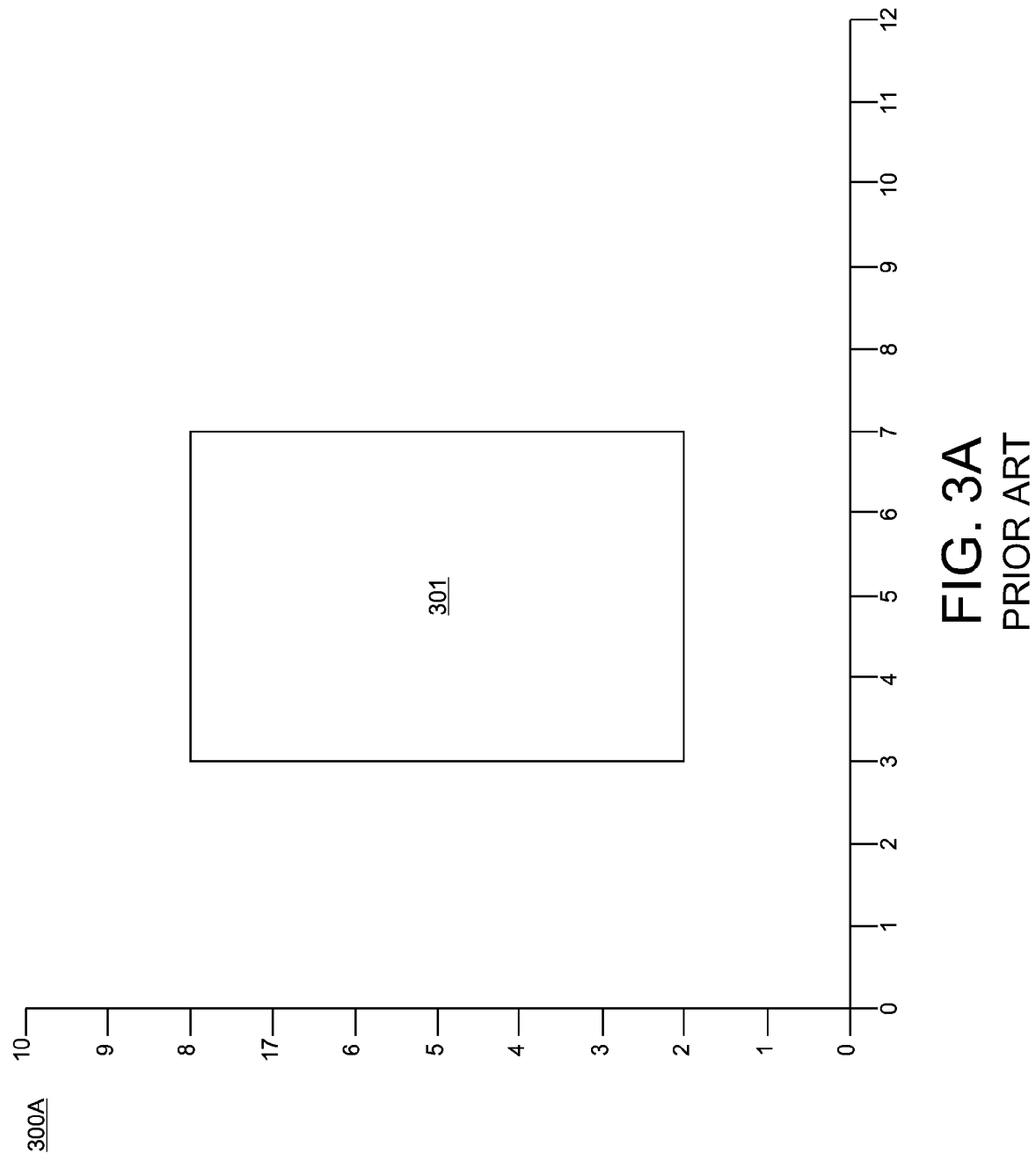
FIG. 3A is a graph illustrating another embodiment of a polygon for a VLSI mask.
Figure 3B:
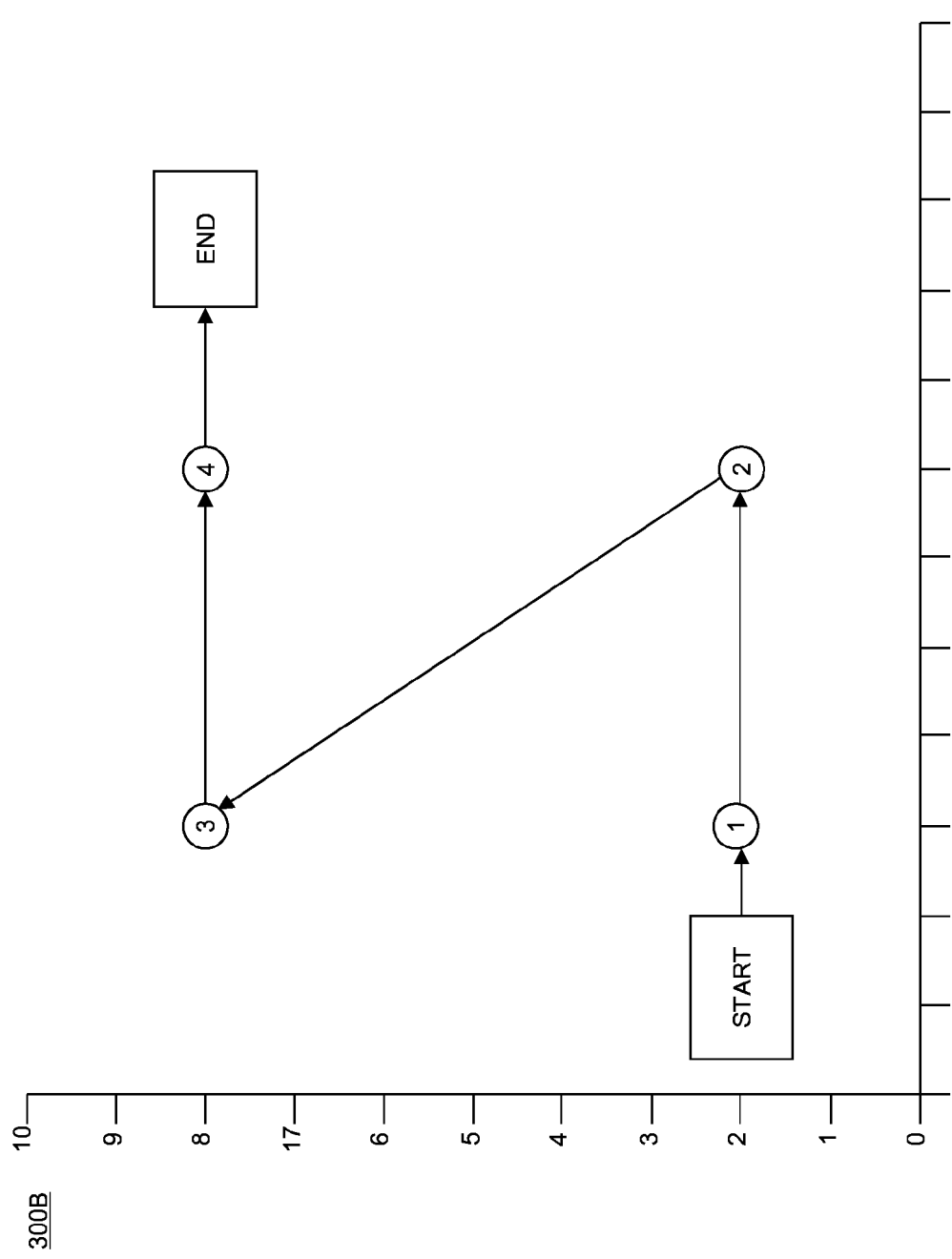
FIG. 3B is a graph illustrating a left-right linked list for the polygon of FIG. 3A.
Figure 3C:
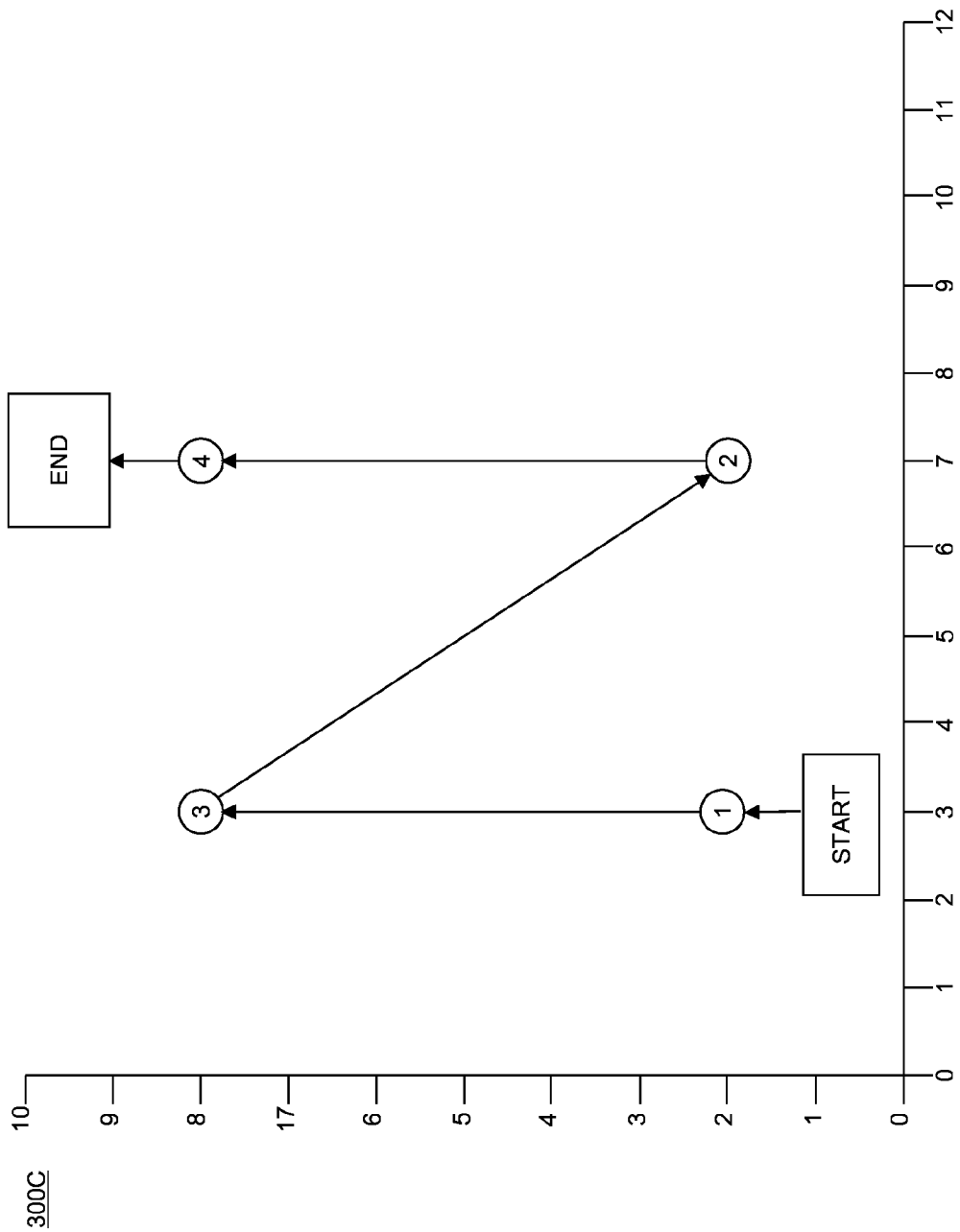
FIG. 3C is a graph illustrating an up-down linked list for the polygon of FIG. 3A.

Therefore, organizing the corners using the 4-directional data structure reduces to sorting the corners in two bidirectional linked lists according to two well-defined orders. By applying an appropriate sorting algorithm, the 4-directional data structure may be achieved in O(k log k) operations in some embodiments. An example of the 4-directional data structure is given with respect to FIGS. 3A-C. FIG. 3A is a graph 300A showing a mask comprising a polygon 301 having corners with coordinates (3,2)-(7,2)-(7,8)-(3,8). Graph 300B FIG. 3B shows the left-right linked list for polygon 301, and graph 300C of FIG. 3C shows the down-up linked list for polygon 301.

Figure 4:
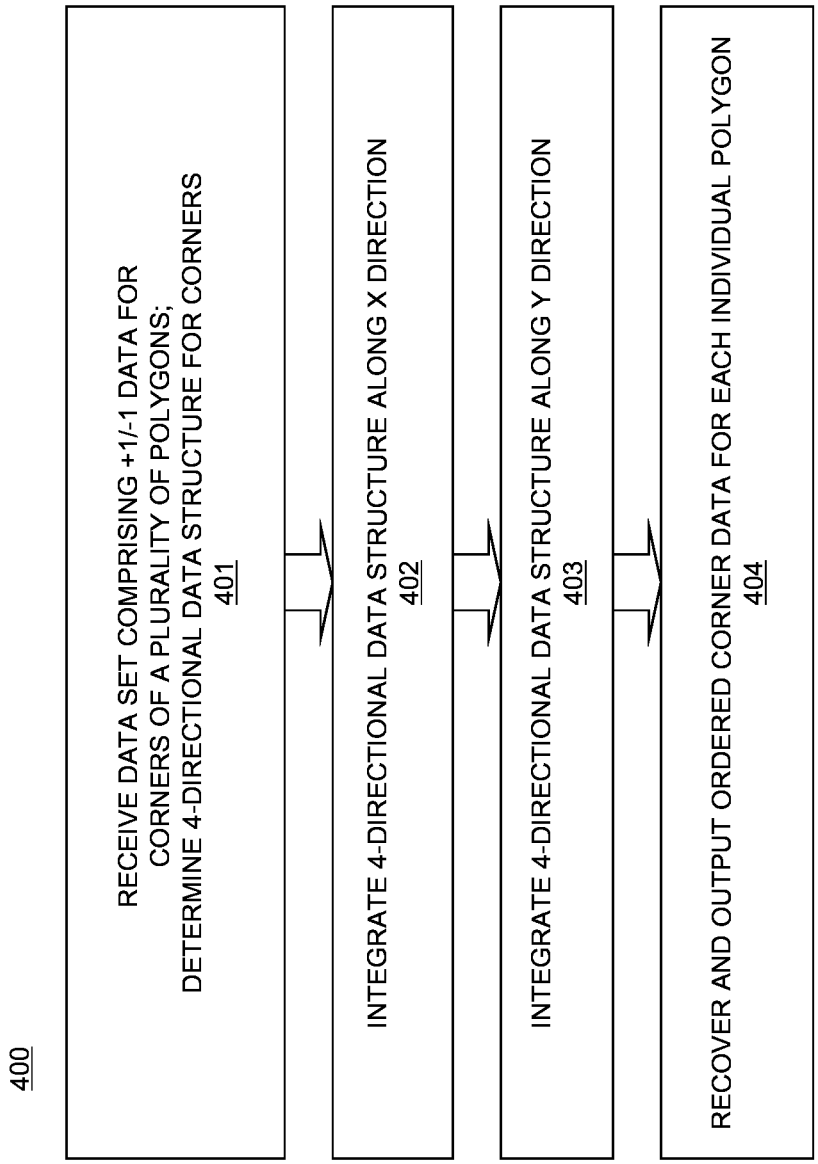
FIG. 4 is a flowchart illustrating an embodiment of a method for polygon recovery for VLSI mask correction.

FIG. 4 shows a flowchart of an embodiment of a method 400 for polygon recovery for VLSI mask correction. First, in block 401, a set of +1/−1 data regarding a plurality of polygons is received, and a sorting algorithm is applied to the data in order to organize the corners in the 4-directional data structure, as is discussed above and shown with respect to FIGS. 3A-C. This may be achieved in O(k log k) operations in some embodiments.

Next, in block 402 of method 400, integration in the x direction is performed to calculate Mm for each point in the +1/−1 data, applying EQ. 1. Table 1 shows an example of pseudocode that integrates along the x direction. Node and NodeL in the pseudocode below each include x, y, c, Mm, and Mp values.

TABLE 1

Integration along the x direction

```
Node = Start → Right
NodeL = Start
while Node ≠ End do
    if Node → y = NodeL → y then
        Node → Mm = NodeL → Mm + NodeL → c
        Node → Mp = NodeL → Mp + Node → c
    else
        Node → Mm = 0
        Node → Mp = Node → c
    end if
    NodeL = Node
    Node = Node → Right
end while
```

Next, in block 403 of method 400, integration in the y direction is performed to calculate Mp for each point in the +1/−1 data, applying EQ. 2. Blocks 402 and 403 together may be performed in O(k) operations in some embodiments. Table 2 shows an example of pseudocode that integrates along the y direction. Node and NodeD in the pseudocode below each include x, y, c, Mm, and Mp values.

TABLE 2

Integration along the y direction

```
Node = Start → Up
NodeD = Start
while Node ≠ End do
    if Node → x = NodeD → x then
        Node → c = Node → Mm + NodeD → c
        Node → Mm = NodeD → c
        Node → Mp = NodeD → Mp + Node → Mp
    else
        Node → c = Node → Mm
        Node → Mm = 0
    end if
    NodeD = Node
    Node = Node → Up
end while
```

After integration in the x and y directions has been performed in blocks 402 and 403 of method 400 of FIG. 4, recovery of the polygons is performed in block 404. Polygon recovery may also be achieved in O(k) operations using two nested loops in some embodiments. An outer loop may step through the polygons, and the inner loop may step through the corners of each individual polygon. The output data structure is a linked list of polygons, where each polygon node includes a pointer (NextP) towards the next polygon, and a pointer (FirstC) towards the first node of a linked list containing the corners of the polygon. Each node in the corner linked list contains the coordinates of the corner and a pointer (NextC) towards the next corner of the polygon.

The first operation in the outer loop is to select a starting corner. In some embodiments, the starting corner may Start→Right, which is the smallest corner according to the horizontal order, and thus comprises a down-left corner. As a down-left corner is selected as the starting corner, the next corner must in the up direction. After the starting corner is selected, the inner loop navigates through all the corners of the current polygon that includes the starting corner. At each iteration of the inner loop, a current corner of the polygon is processed, and then processing proceeds to a next corner. The decision of the next direction in which to go to arrive at the next corner is made based on the direction from which the current corner was arrived.

After adding the current corner to an output data structure and deciding where to go next, the current corner is deleted from the left-right linked list, i.e., the Right pointer R of the next node to the left of the current corner bypasses the current corner and points directly towards the node to its right, and similarly the Left pointer L of the next node to the right of the current corner bypasses the current corner and points directly towards the node to its left. The next corner then becomes the current corner. It is determined that the current corner is the last corner of a polygon and the inner loop may be exited when the next node to go to is Start. Because the first node was Start→Right, which is a down-left corner of the current polygon, the last corner of the current polygon is the corner to the right of this down-left corner. Because the starting down-left corner was deleted from the left-right linked list, the Left pointer of the last corner of the polygon will point towards Start.

At the beginning of each iteration of the outer loop, Start→Right will point to a down-left corner of the new current polygon, because all the corners of any previously processed polygons have been deleted from the left-right linked list. As the left-right linked list preserves the horizontal order of the remaining corners, Start→Right is the smallest corner (with respect to the horizontal order) among the set of remaining corners, and is therefore the down-left corner of the new current polygon. The outer loop stops when Start→Right is End, when all the corners in the dataset have been processed. Table 3 shows an example of pseudocode illustrating an embodiment of polygon recovery.

TABLE 3

Polygon recovery

```
// Initialize the polygon linked list
DummyPolygon = new Polygon
Pol = DummyPolygon
// Outer loop
while Start → Right ≠ End do
    // New current polygon
    Pol → NextP = new Polygon
    Pol = Pol → NextP
    // Initialize the corner linked list
    Pol → FirstC = new Corner
    Cor = Pol → FirstC
    // Select down-left corner
    Node = Start → Right
    // Copy the corner's coordinates
    Cor → x = Node → x
    Cor → y = Node → y
    // Delete the node from the left-right linked list
    Node → Left → Right = Node → Right
    Node → Right → Left = Node → Left
    // Go up
    Direction = Up
    Node = Node → Up
    // Inner loop
    while Node ≠ Start do
        // New corner
        Cor → NextC = new Corner
        Cor = Cor → NextC
        // Copy the corner's coordinates
        Cor → x = Node → x
        Cor → y = Node → y
        // Delete the node from the left-right linked list
        Node → Left → Right = Node → Right
        Node → Right → Left = Node → Left
        //Based on last direction and Mm and Mp values, choose
        next direction
        if Direction = Up then
            if Mp = 1 then
                Direction = Left
                Node = Node → Left
            else
                Direction = Right
                Node = Node → Right
            end if
        else if Direction = Right then
            if Mp = 1 then
                Direction = Up
                Node = Node → Up
            else
                Direction = Down
                Node = Node → Down
            end if
        else if Direction = Down then
            if Mm = 1 then
                Direction = Right
                Node = Node → Right
            else
                Direction = Left
                Node = Node → Left
            end if
        else
            if Mm = 1 then
                Direction = Down
                Node = Node → Down
            else
```

TABLE 3-continued

Polygon recovery

```
                Direction = Up
                Node = Node → Up
            end if
        end if
    end while
        Cor → NextC = NULL
end while
Pol → NextP = NULL
//Remove the dummy polygon at the beginning of the linked list
FirstPolygon = DummyPolygon → NextP
return FirstPolygon
```

Figure 5:
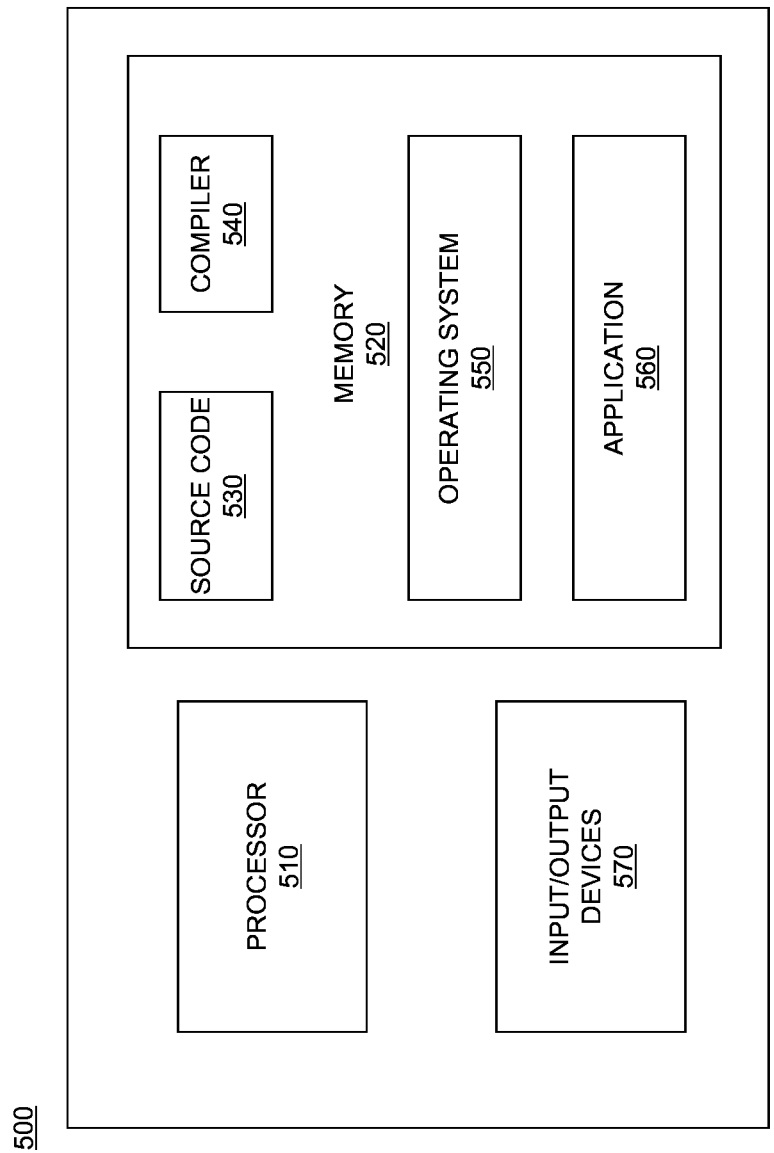
FIG. 5 is a block diagram of an embodiment of a computer that may be used in conjunction with embodiments of polygon recovery for VLSI mask correction.

FIG. 5 illustrates an example of a computer 500 which may be utilized by exemplary embodiments of polygon recovery for VLSI mask correction. Various operations discussed above may utilize the capabilities of the computer 500. One or more of the capabilities of the computer 500 may be incorporated in any element, module, application, and/or component discussed herein.

The computer 500 includes, but is not limited to, PCs, workstations, laptops, PDAs, palm devices, servers, storages, and the like. Generally, in terms of hardware architecture, the computer 500 may include one or more processors 510, memory 520, and one or more I/O devices 570 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 510 is a hardware device for executing software that can be stored in the memory 520. The processor 510 can be virtually any custom made or commercially available processor, a central processing unit (CPU), a digital signal processor (DSP), or an auxiliary processor among several processors associated with the computer 500, and the processor 510 may be a semiconductor based microprocessor (in the form of a microchip) or a macroprocessor.

The memory 520 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 520 may incorporate electronic, magnetic, optical, and/or other types of storage media. Note that the memory 520 can have a distributed architecture, where various components are situated remote from one another, but can be accessed by the processor 510.

The software in the memory 520 may include one or more separate programs, each of which comprises an ordered listing of executable instructions for implementing logical functions. The software in the memory 520 includes a suitable operating system (O/S) 550, compiler 540, source code 530, and one or more applications 560 in accordance with exemplary embodiments. As illustrated, the application 560 comprises numerous functional components for implementing the features and operations of the exemplary embodiments. The application 560 of the computer 500 may represent various applications, computational units, logic, functional units, processes, operations, virtual entities, and/or modules in accordance with exemplary embodiments, but the application 560 is not meant to be a limitation.

The operating system 550 controls the execution of other computer programs, and provides scheduling, input-output control, file and data management, memory management, and communication control and related services. It is contemplated by the inventors that the application 560 for implementing exemplary embodiments may be applicable on all commercially available operating systems.

Application 560 may be a source program, executable program (object code), script, or any other entity comprising a set of instructions to be performed. When a source program, then the program is usually translated via a compiler (such as the compiler 540), assembler, interpreter, or the like, which may or may not be included within the memory 520, so as to operate properly in connection with the O/S 550. Furthermore, the application 560 can be written as an object oriented programming language, which has classes of data and methods, or a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 570 may include input devices such as, for example but not limited to, a mouse, keyboard, scanner, microphone, camera, etc. Furthermore, the I/O devices 570 may also include output devices, for example but not limited to a printer, display, etc. Finally, the I/O devices 570 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 570 also include components for communicating over various networks, such as the Internet or intranet.

If the computer 500 is a PC, workstation, intelligent device or the like, the software in the memory 520 may further include a basic input output system (BIOS) (omitted for simplicity). The BIOS is a set of essential software routines that initialize and test hardware at startup, start the O/S 1050, and support the transfer of data among the hardware devices. The BIOS is stored in some type of read-only-memory, such as ROM, PROM, EPROM, EEPROM or the like, so that the BIOS can be executed when the computer 500 is activated.

When the computer 500 is in operation, the processor 510 is configured to execute software stored within the memory 520, to communicate data to and from the memory 520, and to generally control operations of the computer 500 pursuant to the software. The application 560 and the O/S 550 are read, in whole or in part, by the processor 510, perhaps buffered within the processor 510, and then executed.

When the application 560 is implemented in software it should be noted that the application 560 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

The application 560 can be embodied in any computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable storage medium" can be any means that can store the program for use by or in connection with the instruction execution system, apparatus, or device. The computer readable storage medium can be, for example but not limited to, an electronic, magnetic, optical, electromagnetic, or semiconductor system, apparatus, or a device.

More specific examples (a nonexhaustive list) of the computer-readable storage medium may include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable storage medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 560 is implemented in hardware, the application 560 can be implemented with any one or a combination of the following technologies, which are well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The technical effects and benefits of exemplary embodiments include reduction in the amount of computation required to recover polygons from their +1/−1 description.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A computer-implemented method for polygon recovery from a +1/−1 description of a plurality of polygons of a very large scale integrated (VLSI) mask for production of a VLSI semiconductor device, comprising:

receiving, by a processor of a computer, a set of data comprising the +1/−1 description of the plurality of polygons of the VLSI mask, the +1/−1 description comprising a plurality of corners;

determining a 4-directional data structure, a Mm value comprising a first limit value, and a Mp value comprising a second limit value for each of the plurality of corners; and recovering the plurality of polygons from the set of data by assigning each of the plurality of corners to a single polygon of the plurality of polygons based on the 4-directional data structure, the Mm value, and the Mp value of each of the plurality of corners, and determining an order of the respective corners of each polygon of the plurality of polygons of the VLSI mask, wherein recovering the plurality of polygons comprises:

determining a starting corner of the plurality of corners;

setting a current corner equal to the starting corner;

based on the Mm value and the Mp value of the current corner, determining a next corner of the plurality of corners, wherein the next corner is assigned to the same polygon of the plurality of polygons as the starting corner;

adding the current corner to an output data structure comprising the recovered polygons;

deleting the current corner from the set of data comprising the +1/−1 description of the plurality of polygons by adjusting the 4-directional data structure for the current corner; and setting the current corner equal to the next corner.

2. The computer-implemented method of claim 1, wherein the polygons comprise rectilinear polygons.

3. The computer-implemented method of claim 1, wherein the 4-directional data structure for a current corner comprises an up pointer, a down pointer, a left pointer, and a right pointer, wherein each of the up pointer, down pointer, left pointer, and right pointer comprises one of 0 and 1 based on a direction from the current corner to a next corner.

4. The computer-implemented method of claim 1, wherein the Mm value for a corner is determined by:

$$Mm = M(x_i^-, y_i^-) = \lim_{\substack{(x,y)\to(x_i,y_i)\\x<x_i, y<y_i}} M(x,y) \sum_{\substack{x_j<x_i\\y_j<y_i}} c_j,$$

wherein $(x_i, y_i)$ comprise coordinates of the corner, and $c_j$ comprises a weight of the corner comprising one of +1 and −1.

5. The computer-implemented method of claim 1, wherein the Mp value for a corner is determined by:

$$Mp = M(x_i^+, y_i^+) = \lim_{\substack{(x,y)\to(x_i,y_i)\\x>x_i, y>y_i}} M(x,y) \sum_{\substack{x_j\leq x_i\\y_j\leq y_i}} c_j,$$

wherein $(x_i, y_i)$ comprise coordinates of the corner, and $c_j$ comprises a weight of the corner comprising one of +1 and −1.

6. The computer-implemented method of claim 1, further comprising repeating the determining the next corner, adding the current corner to the output data structure, deleting the current corner, and setting the current corner equal to the next corner for each of the plurality of corners in the set of data comprising the +1/−1 description of the plurality of polygons.

7. The computer-implemented method of claim 1, wherein the output data structure comprises a set of nodes, each node corresponding to one of the plurality of polygons, wherein each node comprises a linked list of corners assigned to the node's respective polygon.

8. The computer-implemented method of claim 1, wherein the starting corner comprises a bottom-left corner of the plurality of corners.

9. The computer-implemented method of claim 1, wherein based on a next corner of a current corner being equal to a dummy node, determining that the current corner is a last corner of a current polygon, and determining a starting corner of a next polygon.

10. A computer program product comprising a computer readable storage medium containing computer code that, when executed by a computer, implements a method for polygon recovery from a +1/−1 description of a plurality of polygons of a very large scale integrated (VLSI) mask for production of a VLSI semiconductor device, wherein the method comprises:

receiving a set of data comprising the +1/−1 description of the plurality of polygons of the VLSI mask, the +1/−1 description comprising a plurality of corners;

determining a 4-directional data structure, a Mm value comprising a first limit value, and a Mp value comprising a second limit value for each of the plurality of corners; and recovering the plurality of polygons from the set of data by assigning each of the plurality of corners to a single polygon of the plurality of polygons based on the 4-directional data structure, the Mm value, and the Mp value of each of the plurality of corners, and determining an order of the respective corners of each polygon of the plurality of polygons of the VLSI mask, wherein recovering the plurality of polygons comprises:
determining a starting corner of the plurality of corners;
setting a current corner equal to the starting corner;
based on the Mm value and the Mp value of the current corner, determining a next corner of the plurality of corners, wherein the next corner is assigned to the same polygon of the plurality of polygons as the starting corner;
adding the current corner to an output data structure comprising the recovered polygons;
deleting the current corner from the set of data comprising the +1/−1 description of the plurality of polygons by adjusting the 4-directional data structure for the current corner; and
setting the current corner equal to the next corner.

11. The computer program product according to claim 10, wherein the polygons comprise rectilinear polygons.

12. The computer program product according to claim 10, wherein the 4-directional data structure for a current corner comprises an up pointer, a down pointer, a left pointer, and a right pointer, wherein each of the up pointer, down pointer, left pointer, and right pointer comprises one of 0 and 1 based on a direction from the current corner to a next corner.

13. The computer program product according to claim 10, further comprising repeating the determining the next corner, adding the current corner to the output data structure, deleting the current corner, and setting the current corner equal to the next corner for each of the plurality of corners in the set of data comprising the +1/−1 description of the plurality of polygons.

14. The computer program product according to claim 10, wherein the output data structure comprises a set of nodes, each node corresponding to one of the plurality of polygons, wherein each node comprises a linked list of corners assigned to the node's respective polygon.

15. The computer program product according to claim 10, wherein the starting corner comprises a bottom-left corner of the plurality of corners.

16. The computer program product according to claim 10, wherein based on a next corner of a current corner being equal to a dummy node, determining that the current corner is a last corner of a current polygon, and determining a starting corner of a next polygon.

* * * * *